(12) United States Patent
Goyal et al.

(10) Patent No.: US 12,113,520 B2
(45) Date of Patent: Oct. 8, 2024

(54) CIRCUIT TO REDUCE GATE INDUCED DRAIN LEAKAGE

(71) Applicant: NXP B.V., Eindhoven (NL)

(72) Inventors: Saurabh Goyal, Sonipat (IN); Krishna Thakur, GautumBudh Nagar (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 18/180,581

(22) Filed: Mar. 8, 2023

(65) Prior Publication Data

US 2024/0213978 A1 Jun. 27, 2024

(30) Foreign Application Priority Data

Dec. 22, 2022 (IN) .............................. 202221074458

(51) Int. Cl.
*H03K 17/16* (2006.01)
(52) U.S. Cl.
CPC .................................. *H03K 17/161* (2013.01)
(58) Field of Classification Search
CPC .................................................... H03K 17/161
USPC ......................................................... 327/109
See application file for complete search history.

(56) References Cited

U.S. PATENT DOCUMENTS

| 11,190,178 B1 * | 11/2021 | Collins ................ H03K 17/063 |
| 2016/0277019 A1 | 9/2016 | Cical et al. |
| 2018/0375507 A1 | 12/2018 | Elsayed |
| 2019/0051367 A1 | 2/2019 | Elsayed |

FOREIGN PATENT DOCUMENTS

EP 3758227 A1 12/2020

* cited by examiner

*Primary Examiner* — Tomi Skibinski

(57) ABSTRACT

A bootstrap switch circuit includes a transistor-based switch controlled by a first gate signal and a leakage protection transistor controlled by a second gate signal configured to reduce gate induced drain leakage in the transistor-based switch. A first gate driver is included that produces a first gate signal at its output so that the first gate signal turns on the transistor-based switch during a sampling mode and turns off the transistor-based switch during a hold mode. A second gate driver is included that produces a second gate signal at its output and to receive the output signal of the bootstrap switch circuit so that the second gate signal turns on the leakage protection transistor during the sampling mode and turns off the leakage protection transistor during the hold mode and the second gate signal is based upon the output signal of the bootstrap switch circuit.

15 Claims, 4 Drawing Sheets

CIRCUIT TO REDUCE GATE INDUCED DRAIN LEAKAGE

CROSS-REFERENCE TO RELATED APPLICATIONS

This application claims the priority under 35 U.S.C. § 119 of India patent application no. 202221074458, filed Dec. 22, 2022 the contents of which are incorporated by reference herein.

TECHNICAL FIELD

Various exemplary embodiments disclosed herein relate generally to a circuit to reduce gate induced drain leakage.

BACKGROUND

Field effect transistors (FET) are widely used as switches in circuits. When a high voltage is applied to the drain when the gate is grounded a leakage current may occur. This is called gate induce drain leakage (GIDL). GIDL is a leakage phenomenon which occurs when a high voltage is applied to the drain with the gate grounded, as a result a deep-depletion region is formed underneath the gate-to-drain overlap region.

SUMMARY

A summary of various exemplary embodiments is presented below. Some simplifications and omissions may be made in the following summary, which is intended to highlight and introduce some aspects of the various exemplary embodiments, but not to limit the scope of the invention. Detailed descriptions of an exemplary embodiment adequate to allow those of ordinary skill in the art to make and use the inventive concepts will follow in later sections.

Various embodiments relate to a bootstrap switch circuit, including: a transistor-based switch controlled by a first gate signal; a leakage protection transistor controlled by a second gate signal connected in series with the transistor-based switch and configured to reduce gate induced drain leakage in the transistor-based switch; a first gate driver configured to produce a first gate signal at its output, wherein the first gate signal turns on the transistor-based switch during a sampling mode in which the bootstrap switch circuit is configured to sample an input voltage and turns off the transistor-based switch during a hold mode in which the bootstrap switch circuit is configured to hold a sampled input voltage; and a second gate driver configured to produce a second gate signal at its output and to receive the output signal of the bootstrap switch circuit, wherein the second gate signal turns on the leakage protection transistor during the sampling mode and turns off the leakage protection transistor during the hold mode and wherein the second gate signal is based upon the output signal of the bootstrap switch circuit.

Various embodiments are described, wherein the first gate driver includes a capacitor connected in series between a first transistor and a second transistor and wherein the first gate driver is configured to charge the capacitor during the hold mode.

Various embodiments are described, wherein the first transistor is a P-type metal-oxide-semiconductor (PMOS) with a gate connected to the first gate signal and the second transistor is a N-type metal-oxide-semiconductor (NMOS) transistor with a gate connected to a first control signal.

Various embodiments are described, wherein the first gate driver includes a third transistor connected in series with a fourth transistor between ground and the output of the first gate driver, wherein a gate of the third transistor is connected to the first control signal, and wherein the output of the first gate driver is connected to ground when the first control signal indicates the hold mode.

Various embodiments are described, wherein the first gate driver includes a fifth transistor connected in series with a sixth transistor between a voltage source and a first node between the capacitor and the second transistor, wherein a gates of the fifth and sixth transistors are connected to a second control signal, wherein the fifth transistor is connected to the voltage source and is an NMOS transistor, and wherein the sixth transistor is connected to the first node and is a PMOS transistor.

Various embodiments are described, wherein the first gate driver includes: a seventh transistor connected between the second gate driver and a second node between the first transistor and the capacitor, wherein the seventh transistor is a PMOS transistor and a gate of the seventh transistor is connected to a third node between the fifth and sixth transistors; an eighth transistor connected between the first node and the third node and wherein a gate of the eight transistor is connected to the first gate signal; and a ninth transistor connected between an input of the bootstrap switch circuit and the first node and where a gate of the ninth transistor is connected to the first gate signal.

Various embodiments are described, wherein second gate driver includes a first transistor connected in series with a current source between a voltage source and ground, wherein a gate of the first transistor is connected to an output of the bootstrap switch circuit, and wherein a voltage at a node between the first transistor and the current source is based upon a voltage at the output of the bootstrap switch circuit.

Various embodiments are described, wherein the second gate driver includes a second transistor connected in series with a third transistor between the node and the output of the second gate driver, wherein a gate of the second transistor is connected to a first control signal, and wherein the output of the first gate driver is connected to the node when the first control signal indicates the hold mode.

Various embodiments are described, wherein the second gate driver includes a fourth transistor connected between the second transistor and the first gate signal and wherein a gate of the fourth transistor is connected to the first gate driver.

Various embodiments are described, wherein the voltage at the node is the voltage at the output of the bootstrap switch circuit minus a threshold voltage of the first transistor.

Various embodiments are described, wherein second gate driver includes a first transistor connected in series with a resistor divider between a voltage source and ground, wherein a gate of the first transistor is connected to an output of the bootstrap switch circuit, and wherein a voltage at a node between the first transistor and the resistor divider is based upon a voltage at the output of the bootstrap switch circuit.

Various embodiments are described, wherein the second gate driver includes a second transistor connected in series with a third transistor between the node and the output of the second gate driver, wherein a gate of the second transistor is connected to a first control signal, and wherein the output of the first gate driver is connected to the node when the first control signal indicates the hold mode.

Various embodiments are described, wherein the second gate driver includes a fourth transistor connected between the second transistor and the first gate signal and wherein a gate of the fourth transistor is connected to the first gate driver.

Various embodiments are described, wherein the voltage at the node is the voltage at the output of the bootstrap switch circuit minus a threshold voltage of the first transistor.

Various embodiments are described, wherein the transistor-based switch includes a first transistor connected in series with a second transistor wherein gates of the first and second transistors are connected to the first gate signal.

BRIEF DESCRIPTION OF THE DRAWINGS

In order to better understand various exemplary embodiments, reference is made to the accompanying drawings, wherein.

To facilitate understanding, identical reference numerals have been used to designate elements having substantially the same or similar structure and/or substantially the same or similar function.

DETAILED DESCRIPTION

The description and drawings illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments.

In various circuit designs GIDL can lead to a leakage current that begins to affect the performance of the circuit and can increase the current draw of the circuit. For example, this problem occurred in the multiplexer design of a 16-bit successive approximation register (SAR) analog-to-digital converter (ADC) design. When the input is greater than the GIDL threshold of a N-type metal-oxide-semiconductor (NMOS) transistor, there will be a leakage flowing into the NMOS transistor in the hold and the sample state that reduces the sampled value and consequently degrades the signal-to-noise and distortion ratio (SINAD) values for the circuit.

An embodiment of a circuit using MOS transistors as switches that reduces the effect of GIDL will be described below in FIG. 3 This circuit embodiment has a variety of features including the following: this circuit does not require external reference to bias the transistor; this circuit also does not require any external circuit like comparator to monitor the GIDL threshold and then bias the transistor to an appropriate value; the circuit eliminates GIDL leakage; and this circuit operates independent of input signal and supply amplitude.

Figure 1:
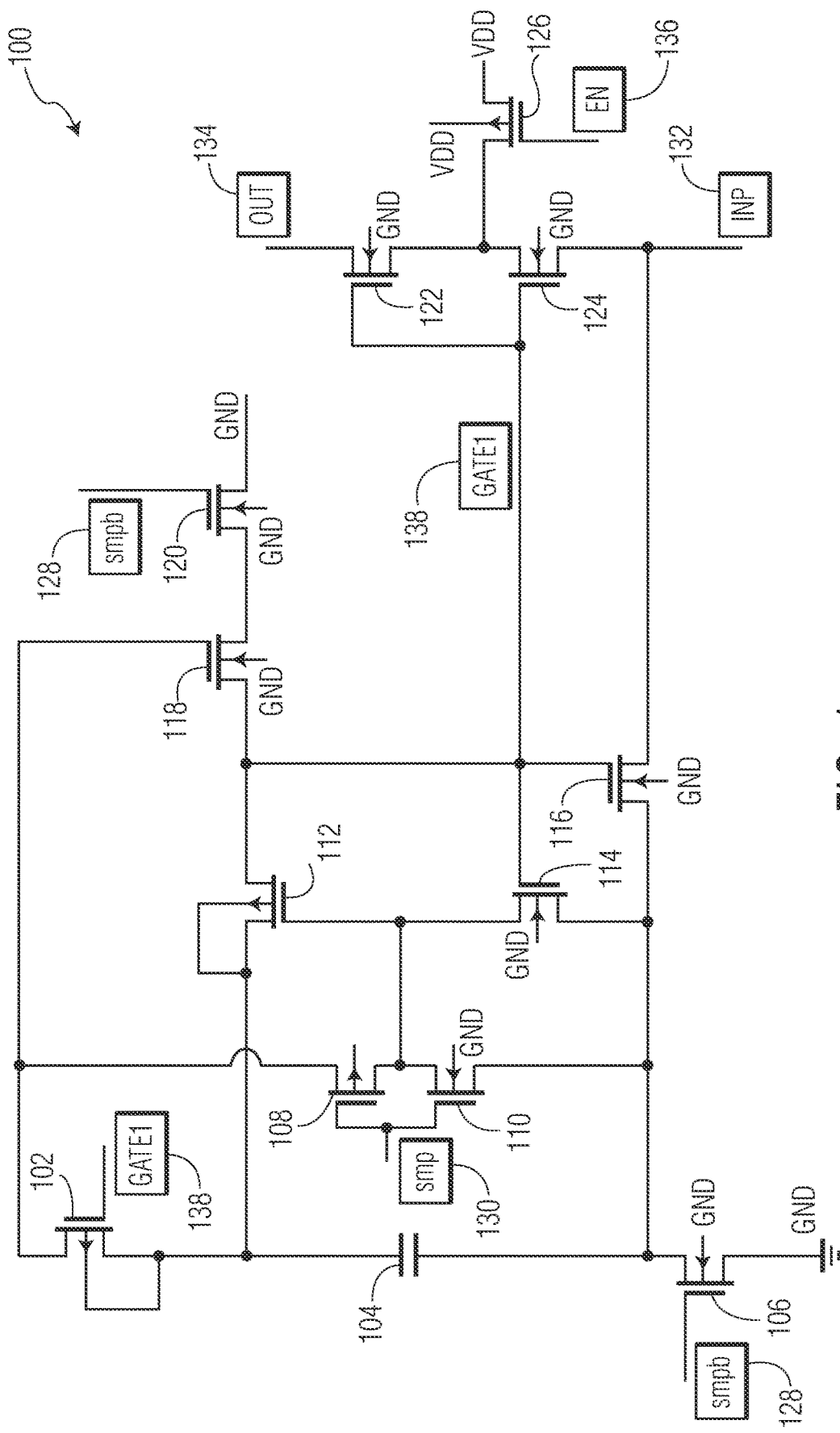
FIG. 1 illustrates a conventional design of bootstrap switch circuit.

FIG. 1 illustrates a conventional design of bootstrap switch circuit. The conventional bootstrap switch circuit 100 includes: NMOS transistors 106, 110, 114, 116, 118, 120, 122, and 124; P-type metal-oxide-semiconductor (PMOS) transistors 102, 108, 112, and 126; capacitor 104; control signal smpb 128; control signal smp 130; input INP 132; output OUT 134; enable signal EN 136; and a first gate control signal GATE1 138. Switching transistor 122 and switching transistor 124 act as a transistor-based switch that produces the output OUT 134 based upon the input INP 132. Further, the enable signal EN 136 is applied to the gate of transistor 126 which enables/disables the operation of the switching function of switching transistor 122 and switching transistor 124. The enable signal EN 136 is encoded to turn the PMOS transistor 126 on and off as appropriate to enable and disable the conventional bootstrap switch circuit 100. GATE1 138 is the signal that controls the gates of switching transistor 122 and switching transistor 124. When GATE1 138 is high, switching transistor 122 and switching transistor 124 are turned on. When GATE1 138 is low, switching transistor 122 and switching transistor 124 are turned off.

Figure 2A:
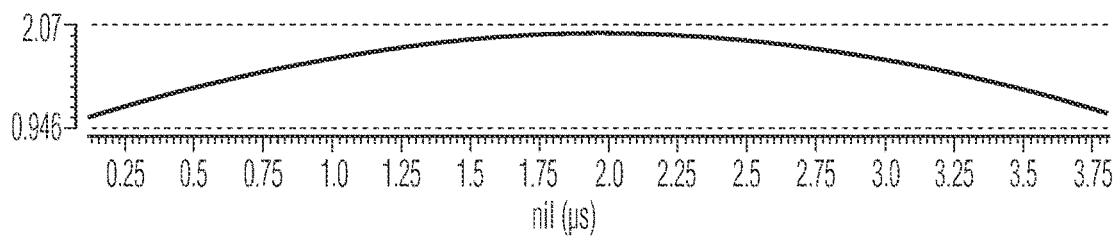
FIG. 2A illustrates a plot of the input INP as a voltage versus time.
Figure 2B:
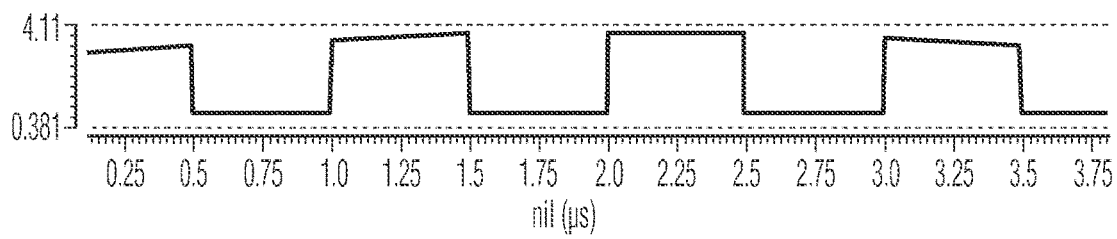
FIG. 2B illustrates a plot of GATE1 as a voltage versus time.
Figure 2C:
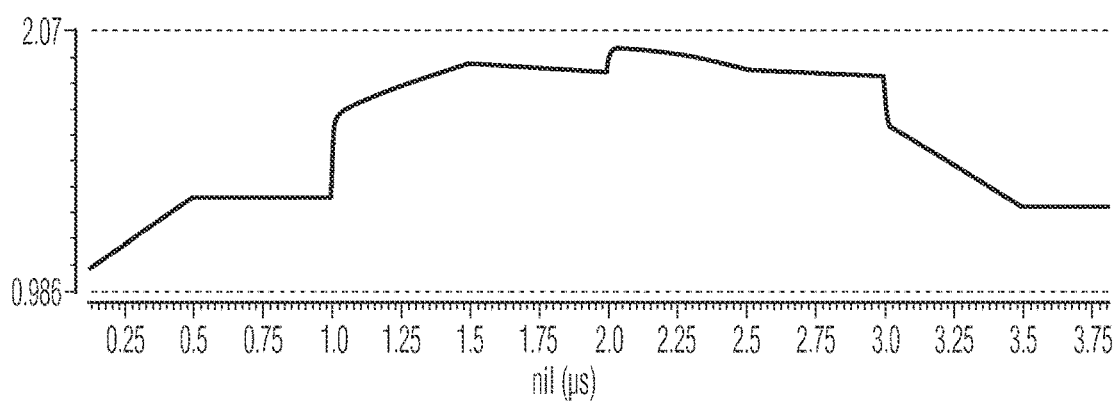
FIG. 2C illustrates a plot of output OUT as a voltage versus time.
Figure 2D:
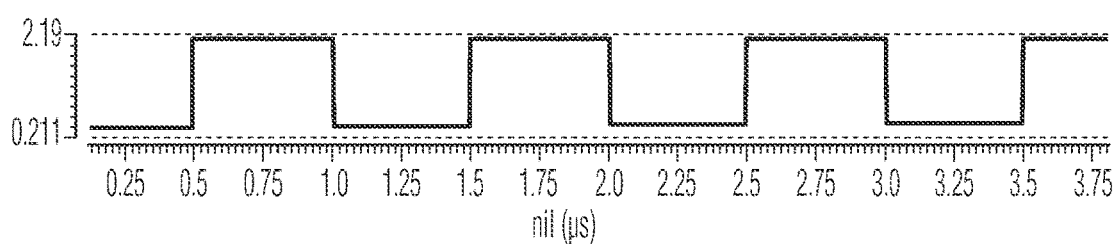
FIG. 2D illustrates a plot of smpb as a voltage versus time.
Figure 2E:
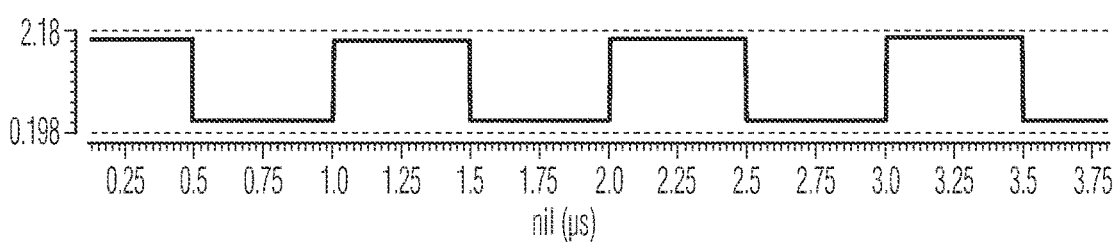
FIG. 2E illustrates a plot of smp as a voltage versus time.

The operation of conventional bootstrap switch circuit 100 will now be described. FIG. 2A illustrates a plot of the input INP 132 as a voltage versus time. FIG. 2B illustrates a plot of GATE1 138 as a voltage versus time. FIG. 2C illustrates a plot of output OUT 134 as a voltage versus time. FIG. 2D illustrates a plot of smpb 128 as a voltage versus time. FIG. 2E illustrates a plot of smp 130 as a voltage versus time. The plots of FIGS. 2A-E show the various signals and their values during the operation of the conventional bootstrap switch circuit 100.

To begin, smpb 128 is low, smp 130 is high, so the conventional bootstrap switch circuit 100 is in the sample state. As a result, output OUT 134 tracks the input INP 132. Because GATE1 138 is high, switching transistor 122 and switching transistor 124 are on and it is assumed that the conventional bootstrap switch circuit 100 is enabled based upon enable signal EN 136. With switching transistor 122 and switching transistor 124 on, the output OUT 134 becomes the same value as input INP 132, and this is shown by output OUT 134 in FIG. 2C.

Next during a hold phase, smpb 128 goes high and smp 130 goes low. This causes transistor 120 to turn on and because transistor 118 is on due to the VDD voltage attached to its gate, GATE1 138 is connected to ground. This causes switching transistor 122 and switching transistor 124 to turn off leaving output OUT 134 at the value of the input INP 132 when the signals switched. This is illustrated in FIG. 2C where output OUT 134 maintains a constant value during this hold phase. As the GATE1 138 discharges to ground, transistor 114 and transistor 116 turn off. Further, with smp 130 low transistor 110 turns off and transistor 108 turns on. When transistor 108 turns on, this causes VDD to be applied to the gate of transistor 112 which turns off transistor 112. Also, as GATE1 138 discharges to ground, transistor 102 turns on. With smpb 128 high transistor 106 also turns on, so that capacitor 104 is charged to a voltage of VDD.

Then the conventional bootstrap switch circuit 100 returns to the sampling mode with smpb 128 going low and smp 130 going high. This causes transistor 110 to turn on and transistor 108 to turn off which causes transistor 112 to turn on connecting the capacitor voltage of capacitor 104 to GATE1 138. Because transistor 120 is switched off as smpb 128 is now low, GATE1 138 is not connected to ground but is connected only to capacitor 104 via transistor 112. Further, the voltage at capacitor 104 is also applied to the gates of transistor 114 and transistor 116 to turn them on. This then applies the voltage at input INP 132 to the lower plate of capacitor 104 which causes the voltage at the upper plate of the capacitor 104 which is connected to GATE1 138 to have a voltage of INP+VDD. This leads to a gate to source voltage (VGS) of VDD for switching transistor 122 and switching transistor 124.

When input INP 132 is >1.5V, then during hold phase when switching transistor 122 and switching transistor 124 are off, the gate to drain voltage (VGD) of switching transistor 122 will be >−1.5V which cause GIDL. GIDL conducting in the off transistors 122 and 124 during the hold and sample phase increases sampling error and degrades SINAD.

A simulation of a sampling multiplexer using conventional bootstrap switch circuit 100 was implemented to determine the performance of the conventional bootstrap switch circuit 100. The simulation showed the following: leakage in during hold phase has a maximum value of 197 nA; leakage during sampling phase is a maximum of 1 uA; SINAD of a sampling multiplexer is 77 dB; and the on-resistance of sampling switch is 225 ohms.

Figure 3:
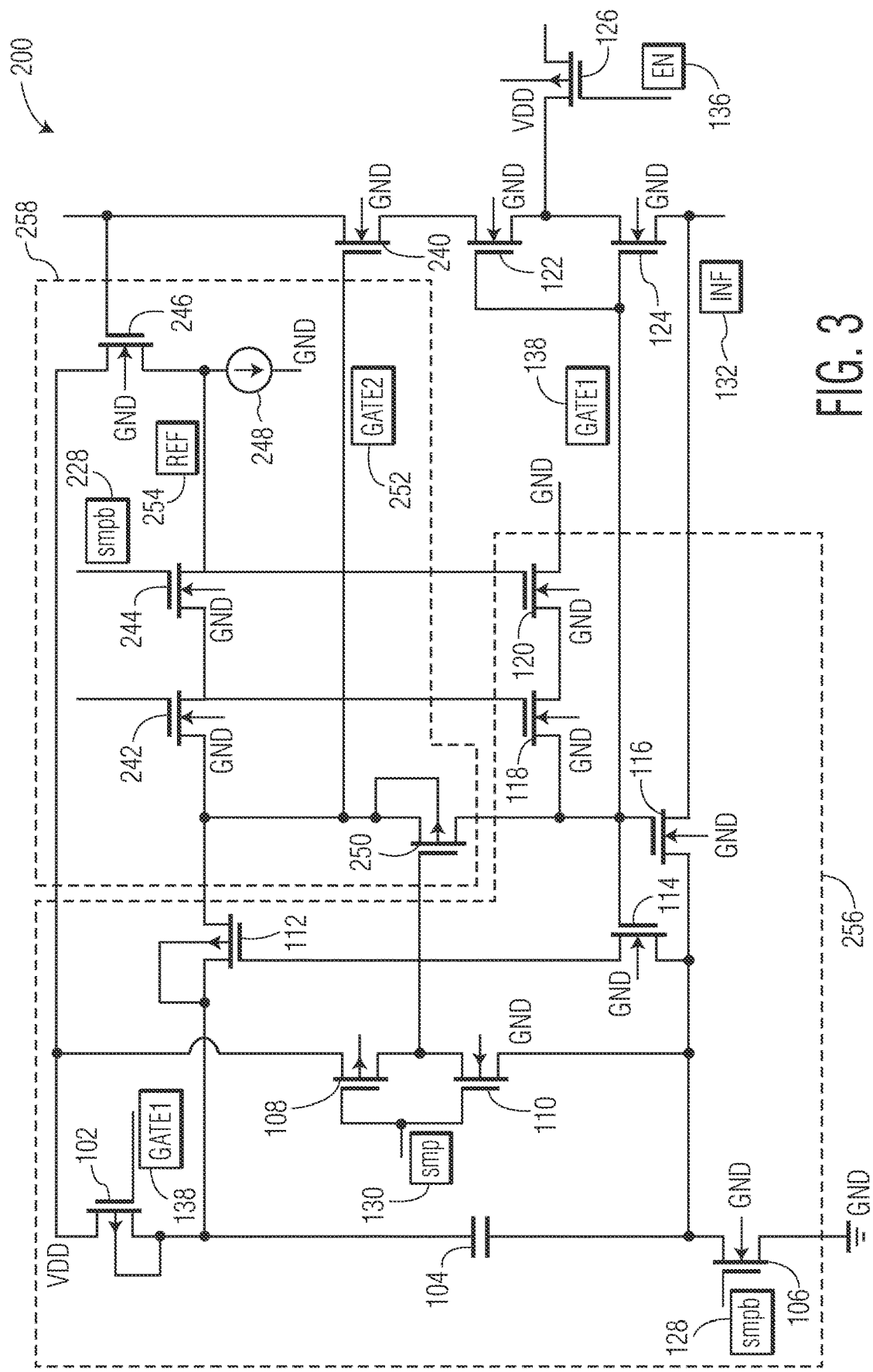
FIG. 3 illustrates an embodiment of a bootstrap switch circuit.

FIG. 3 illustrates an embodiment of a bootstrap switch circuit 200. The bootstrap switch circuit 200 is configured to reduce the GIDL across switching transistor 122 and switching transistor 124. The bootstrap switch circuit 200 adds leakage protection transistor 240, transistor 242, transistor 244, transistor 250, current source 248, and a second gate control signal GATE2 252. The bulk of bootstrap switch circuit 200 is the same as conventional bootstrap switch circuit 100 and the same reference numbers from FIG. 1 are used throughout FIG. 2. Transistor 102, capacitor 104, transistor 106, transistor 108, transistor 110, transistor 112, transistor 114, and transistor 116 form a GATE1 driver 256. The GATE1 driver 256 produces the gate drive signal GATE1 138 that is applied to the gates of transistor 122 and transistor 124. Further, transistor 242, transistor 244, transistor 246, current source 248, and transistor 250 form a GATE2 driver 258. The GATE2 driver 258 produces the gate drive signal GATE2 252 that is applied to the gate of the leakage protection transistor 240.

Switching transistor 122 and switching transistor 124 act as a transistor-based switch that produces the output OUT 134 based upon the input INP 132. The leakage protection transistor 240 is connected in series with switching transistor 122 and 124, and the output OUT 134 comes from leakage protection transistor 240. Further, the enable signal EN 136 is applied to the gate of transistor 126 which enables/disables the operation of the switching function of switching transistor 122 and switching transistor 124. The enable signal EN 136 is encoded to turn the PMOS transistor 126 on and off as appropriate to enable and disable the bootstrap switch circuit 200. GATE1 138 is the signal that controls the gates of switching transistor 122 and switching transistor 124. When GATE1 138 is high, switching transistor 122 and switching transistor 124 are turned on. When GATE1 138 is low, switching transistor 122 and switching transistor 124 are turned off. GATE2 252 controls the operation of leakage protection transistor 240. When GATE2 252 is high, leakage protection transistor 240 is on, and when GATE2 252 is low, leakage protection transistor 240 is off. The leakage protection transistor 240 isolates switching transistor 122 and switching transistor 124 from the output voltage that is held at the output, and thus can prevent GIDL in switching transistor 122 and switching transistor 124. Further, leakage protection transistor 240 is controlled so that its VGS remains below a value where GIDL will occur.

Figure 4A:
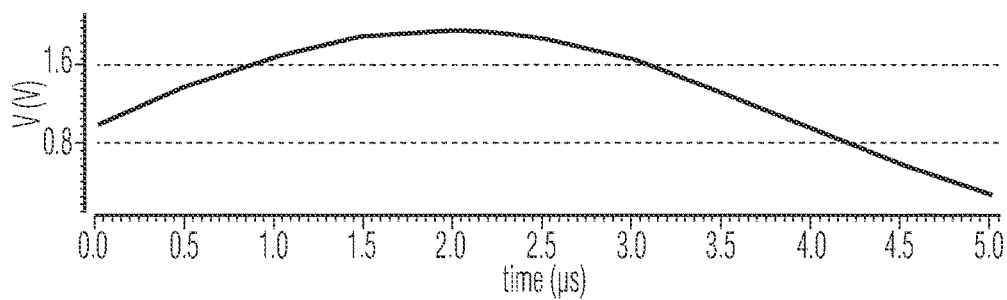
FIG. 4A illustrates a plot of the input INP as a voltage versus time.
Figure 4B:
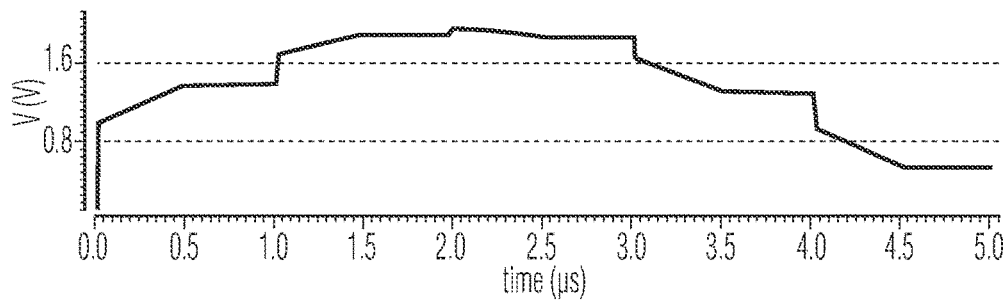
FIG. 4B illustrates a plot of output OUT as a voltage versus time.
Figure 4C:
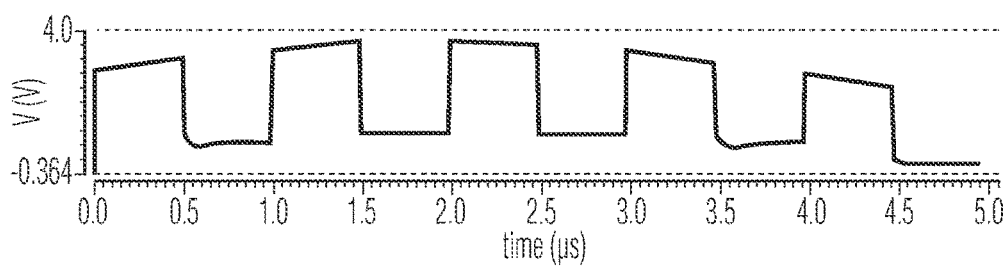
FIG. 4C illustrates a plot of output GATE2 as a voltage versus time.
Figure 4D:
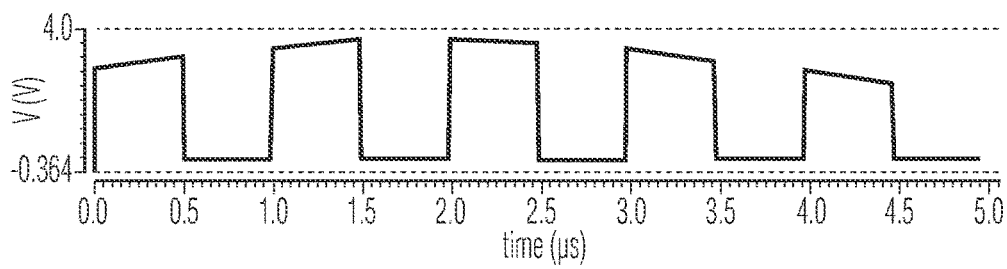
FIG. 4D illustrates a plot of output GATE1 as a voltage versus time.
Figure 4E:
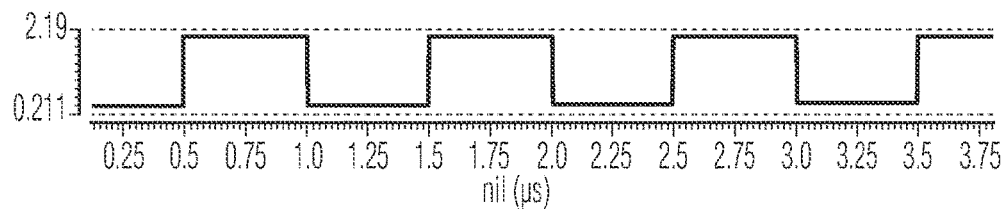
FIG. 4E illustrates a plot of smpb as a voltage versus time.
Figure 4F:
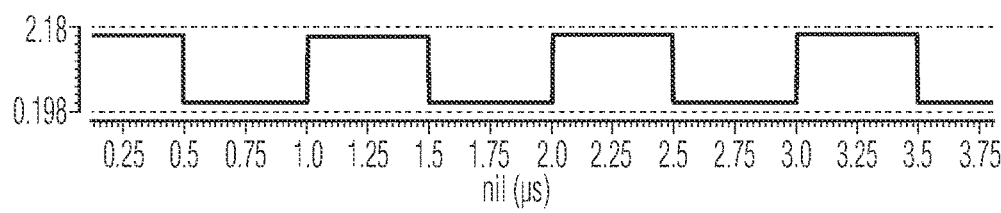
FIG. 4F illustrates a plot of smp as a voltage versus time.

The operation of bootstrap switch circuit 200 will now be described. FIG. 4A illustrates a plot of the input INP 132 as a voltage versus time. FIG. 4B illustrates a plot of output OUT 134 as a voltage versus time. FIG. 4C illustrates a plot of output GATE2 252 as a voltage versus time. FIG. 4D illustrates a plot of output GATE1 138 as a voltage versus time. FIG. 4E illustrates a plot of smpb 128 as a voltage versus time. FIG. 4F illustrates a plot of smp 130 as a voltage versus time. The plots of FIGS. 4A-F show the various signals and their values during the operation of the conventional bootstrap switch circuit 200.

To begin, smpb 128 is low, smp 130 is high, so the bootstrap switch circuit 200 is in the sample state. As a result, output OUT 134 tracks the input INP 132. Because GATE1 138 is high switching transistor 122 and switching transistor 124 are on, because GATE2 252 is high, leakage protection transistor 240 is on, and it is assumed that the conventional bootstrap switch circuit 100 is enabled based upon enable signal EN 136. With switching transistor 122, switching transistor 124, and leakage protection transistor 240 on, the output OUT 134 becomes the same value as input INP 132, and this is shown by output OUT 134 in FIG. 4B.

Next during a hold phase, smpb 128 goes high and smp 130 goes low. This causes transistor 120 to turn on and because transistor 118 is on due to the VDD voltage attached to its gate, GATE1 138 is connected to ground. This causes switching transistor 122 and switching transistor 124 to turn off leaving output OUT 134 at value of the input INP 132 when the signals switched. This is illustrated in FIG. 4B where output OUT 134 maintains a constant value during this sampling phase. As GATE1 138 discharges to ground, transistor 114 and transistor 116 turn off. Further, with smp 130 low, transistor 110 turns off and transistor 108 turns on. When transistor 108 turns on, this causes VDD to be applied to the gate of transistor 112 and transistor 250 which turns off transistor 112 and transistor 250. Also, as GATE1 138 discharges to ground, transistor 102 turns on. With smpb 128 high, transistor 106 also turns on, so that capacitor 104 is charged to a voltage of VDD.

With transistor 246 connected between VDD and the current source 248 and the gate of transistor 246 connected to the output OUT 134, a reference voltage Ref 254 is generated. The Ref 254 will be OUT−VOV. VOV is VGS−VTH where VTH is the threshold voltage of transistor 246. It is Ref 254 that then becomes GATE2 252 that is applied to the gate of leakage protection transistor 240. This means that the VGD of leakage protection transistor 240 is Ref–

OUT=OUT−VOV−OUT=−VOV. So, the value of VOV is set so that it is less than the voltage that would lead to GIDL. This stops the leakage current through the switching transistor 122 and switching transistor 124.

Ref 254 is illustrated as being generated using current source 248, but in an alternative embodiment a resistor divider may be used in place of current source 248 to generate Ref 254.

Then the bootstrap switch circuit 200 returns to the sampling mode with smpb 128 going low and smp 130 going high. This causes transistor 110 to turn on and transistor 108 to turn off, which causes transistor 112 and leakage protection transistor 240 to turn on connecting the capacitor to GATE1 138. Because transistor 120 is switched off as smpb 128 is now low, GATE1 138 is not connected to ground but is connected only to capacitor 104 via transistor 112 and leakage protection transistor 240. Further, the voltage at capacitor 104 is also applied to the gates of transistor 114 and transistor 116 to turn them on. This then applies the voltage at input INP 132 to the lower plate of capacitor 104 which causes the voltage at the upper plate of the capacitor 104 which is connected to GATE1 138 to have a voltage of INP+VDD. This leads to gate to a source voltage (VGS) of VDD for switching transistor 122 and switching transistor 124.

A simulation of a sampling multiplexer using bootstrap switch circuit 200 was implemented to determine the performance of the conventional bootstrap switch circuit 200. The simulation showed the following: leakage in during hold phase has a maximum value of 23 nA; leakage during sampling phase is a maximum of 25 nA; SINAD of a sampling multiplexer is 86 dB; and the on-resistance of sampling switch is 282 ohms.

It should be appreciated by those skilled in the art that any block diagrams herein represent conceptual views of illustrative circuitry embodying the principles of the invention.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

What is claimed is:

1. A bootstrap switch circuit, comprising:
    a transistor-based switch controlled by a first gate signal;
    a leakage protection transistor configured to be controlled by a second gate signal and connected in series with the transistor-based switch and configured to reduce gate induced drain leakage in the transistor-based switch;
    a first gate driver configured to produce a first gate signal at its output, wherein the first gate signal is configured to turn on the transistor-based switch during a sampling mode in which the bootstrap switch circuit is configured to sample an input voltage and turn off the transistor-based switch during a hold mode in which the bootstrap switch circuit is configured to hold a sampled input voltage; and
    a second gate driver configured to produce a second gate signal at its output and to receive an output signal of the bootstrap switch circuit, wherein the second gate signal is configured to turn on the leakage protection transistor during the sampling mode and turn off the leakage protection transistor during the hold mode and wherein the second gate signal is based upon the output signal of the bootstrap switch circuit.

2. The bootstrap switch circuit of claim 1, wherein the first gate driver includes a capacitor connected in series between a first transistor and a second transistor and wherein the first gate driver is configured to charge the capacitor during the hold mode.

3. The bootstrap switch circuit of claim 2, wherein the first transistor is a P-type metal-oxide-semiconductor (PMOS) with a gate connected to the first gate signal and the second transistor is a N-type metal-oxide-semiconductor (NMOS) transistor with a gate connected to a first control signal.

4. The bootstrap switch circuit of claim 3, wherein the first gate driver includes a third transistor connected in series with a fourth transistor between ground and the output of the first gate driver, wherein a gate of the third transistor is connected to the first control signal, and wherein the output of the first gate driver is connected to ground when the first control signal indicates the hold mode.

5. The bootstrap switch circuit of claim 4, wherein the first gate driver includes a fifth transistor connected in series with a sixth transistor between a voltage source and a first node between the capacitor and the second transistor, wherein gates of the fifth and sixth transistors are connected to a second control signal, wherein the fifth transistor is connected to the voltage source and is an NMOS transistor, and wherein the sixth transistor is connected to the first node and is a PMOS transistor.

6. The bootstrap switch circuit of claim 5, wherein the first gate driver includes:
    a seventh transistor connected between the second gate driver and a second node between the first transistor and the capacitor, wherein the seventh transistor is a PMOS transistor and a gate of the seventh transistor is connected to a third node between the fifth and sixth transistors;
    an eighth transistor connected between the first node and the third node and wherein a gate of the eight transistor is connected to the first gate signal; and
    a ninth transistor connected between an input of the bootstrap switch circuit and the first node and where a gate of the ninth transistor is connected to the first gate signal.

7. The bootstrap switch circuit of claim 1, wherein second gate driver includes a first transistor connected in series with a current source between a voltage source and ground, wherein a gate of the first transistor is connected to an output of the bootstrap switch circuit, and wherein a voltage at a node between the first transistor and the current source is based upon a voltage at the output of the bootstrap switch circuit.

8. The bootstrap switch circuit of claim 7, wherein the second gate driver includes a second transistor connected in series with a third transistor between the node and the output of the second gate driver, wherein a gate of the second transistor is connected to a first control signal, and wherein the output of the first gate driver is connected to the node when the first control signal indicates the hold mode.

9. The bootstrap switch circuit of claim 8, wherein the second gate driver includes a fourth transistor connected between the second transistor and the first gate signal and wherein a gate of the fourth transistor is connected to the first gate driver.

10. The bootstrap switch circuit of claim 7, wherein the voltage at the node is the voltage at the output of the bootstrap switch circuit minus a threshold voltage of the first transistor.

11. The bootstrap switch circuit of claim 10, wherein the voltage at the node is the voltage at the output of the bootstrap switch circuit minus a threshold voltage of the first transistor.

12. The bootstrap switch circuit of claim 1, wherein second gate driver includes a first transistor connected in series with a resistor divider between a voltage source and ground, wherein a gate of the first transistor is connected to an output of the bootstrap switch circuit, and wherein a voltage at a node between the first transistor and the resistor divider is based upon a voltage at the output of the bootstrap switch circuit.

13. The bootstrap switch circuit of claim 12, wherein the second gate driver includes a second transistor connected in series with a third transistor between the node and the output of the second gate driver, wherein a gate of the second transistor is connected to a first control signal, and wherein the output of the first gate driver is connected to the node when the first control signal indicates the hold mode.

14. The bootstrap switch circuit of claim 13, wherein the second gate driver includes a fourth transistor connected between the second transistor and the first gate signal and wherein a gate of the fourth transistor is connected to the first gate driver.

15. The bootstrap switch circuit of claim 1, wherein the transistor-based switch includes a first transistor connected in series with a second transistor wherein gates of the first and second transistors are connected to the first gate signal.

* * * * *